United States Patent
Yoneda et al.

(10) Patent No.: US 8,253,207 B2
(45) Date of Patent: Aug. 28, 2012

(54) INSULATED GATE SEMICONDUCTOR DEVICE

(75) Inventors: Shuji Yoneda, Ora-gun (JP); Hiroyasu Ishida, Takasaki (JP); Makoto Oikawa, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 343 days.

(21) Appl. No.: 12/645,942

(22) Filed: Dec. 23, 2009

(65) Prior Publication Data

US 2010/0163922 A1 Jul. 1, 2010

(30) Foreign Application Priority Data

Dec. 25, 2008 (JP) ................................. 2008-330813

(51) Int. Cl.
*H01L 27/11* (2006.01)

(52) U.S. Cl. ................ 257/379; 257/288; 257/E27.019; 438/200; 438/210

(58) Field of Classification Search .................. 257/288, 257/379

See application file for complete search history.

(56) References Cited

U.S. PATENT DOCUMENTS 6,541,826 B2 4/2003 Iwagami et al.
2002/0113274 A1* 8/2002 Iwagami et al. .............. 257/379

FOREIGN PATENT DOCUMENTS

JP 2005-302380 10/2005
WO WO-00/33380 6/2000

* cited by examiner

*Primary Examiner* — Ajay K Arora
(74) *Attorney, Agent, or Firm* — Morrison & Foerster LLP

(57) ABSTRACT

By integrating a diode and a resistor connected in parallel into the same chip as an IGBT and connecting a cathode of the diode to a gate of the IGBT, the value of dv/dt can be limited to a predetermined range inside the chip of the IGBT without a deterioration in turn-on characteristics. Since the chip includes a resistor having such a resistance that a dv/dt breakdown of the IGBT can be prevented, the IGBT can be prevented from being broken by an increase in dv/dt at a site (user site) to which the chip is supplied.

5 Claims, 9 Drawing Sheets

Prior Art

Prior Art

Prior Art

INSULATED GATE SEMICONDUCTOR DEVICE

This application claims priority from Japanese Patent Application Number JP 2008-330813, filed on Dec. 25, 2008, the content of which is incorporated herein by reference in its entirety.

BACKGROUND OF THE INVENTION

1. Field of the Invention

The present invention relates to an insulated gate semiconductor device, and particularly to an insulated gate semiconductor device in which an insulated gate semiconductor element to be used for current control for a luminous tube is prevented from being broken by an increase in the rate of voltage change.

2. Description of the Related Art

Insulated gate bipolar transistors (hereinafter referred to as IGBTs) have been used as switching elements for performing current control and the like for light-emitting devices (flashes) for use in digital still cameras and mobile phone's camera functions (e.g., see Japanese Patent Application Publication No. 2005-302380).

With reference to FIG. 9, one example of a conventional light-emitting device will be described. FIG. 9 is a circuit diagram showing the entire configuration of the light-emitting device. A description will be made by taking as an example the case where a xenon discharge tube is used as a luminous tube.

The principal operation of the circuit will be described with reference to FIG. 9. A step-up transformer 36 raises the voltage of a power-source battery 38 to a predetermined voltage, and charge is stored in a main capacitor 35. When a switching element 60 is turned on by a gate drive circuit 37, a trigger voltage is applied from a trigger circuit 30 to a xenon discharge tube as a luminous tube 40. Upon receipt of the trigger voltage, the luminous tube 40 starts light emission. Turning off the switching element 60 with predetermined timing stops the luminous tube 40 from emitting light.

The switching element 60 is principally intended to control the stopping of light emission with high accuracy, and is an IGBT with high power and excellent response characteristics. A gate G of the switching element (IGBT) 60 is connected to the gate drive circuit 37 through a gate resistor Rg. The turning on/off of the IGBT 60 is controlled based on a signal from the gate drive circuit 37.

FIG. 10 is a plan view showing part of a chip of the IGBT 60. The IGBT 60 (the chip thereof) is provided with a gate-to-emitter protection diode 60d and an active area (two-dot chain lines) 60e where transistor cells are disposed. The active area 60e includes, for example, a trench 63 having inner walls covered with a gate insulating film (not shown), a gate electrode 64 buried in the trench 63, and emitter regions 66 provided adjacent to the trench 63. The regions surrounded by the trench 63 serve as transistor cells. On the active area 60e, an emitter electrode 67 is provided with an insulating film (not shown) interposed therebetween. The emitter electrode 67 is in contact with the emitter regions 66 through emitter contact regions 65. The protection diode 60d is disposed outside the active area 60e, e.g., in a chip corner portion. The gate electrode 64 of the active area 60e is connected to a gate pad portion 69 through a gate interconnection portion 68.

FIG. 11 is a view showing the relationship between each of collector-emitter voltage VCE, collector current IC, and gate voltage VG and turn-off loss during the turn-on and turn-off of the IGBT 60.

A turn-on interval (rise time tr) is the interval (period of time) taken by the collector-emitter voltage VCE to decrease from 90% to 10%, and a turn-off interval (fall time tf) is the interval (period of time) taken by the collector current IC to decrease from 90% to 10%. Loss (current×voltage) during the turn-on interval and loss during the turn-off interval are called turn-on loss and turn-off loss, respectively. In FIG. 11, the slope of the collector-emitter voltage VCE in the turn-off interval is dv/dt. The hatched portion in FIG. 11 represents the value of the turn-off loss.

The gate resistor Rg is externally connected to the chip of the IGBT 60 (FIG. 9). The rate (hereinafter referred to as dv/dt) of change of the collector-emitter voltage VCE during the turn-off of the IGBT 60 is adjusted using the resistance of the gate resistor Rg. Further, the time (rise time tr) taken by the IGBT 60 to be turned on is determined by the value of the gate resistor Rg.

In IGBTs, when the value of dv/dt during turn-off is large, transistor cells operate unevenly to cause the concentration of heat on some of the cells due to characteristics of IGBTs. This may result in a breakdown of an IGBT (such breakdown is hereinafter referred to as dv/dt breakdown). Accordingly, in general, a circuit configuration is employed in which the gate resistor Rg is connected to the gate G of the IGBT 60 as in FIG. 9. The value of dv/dt can be reduced by increasing the resistance of the gate resistor Rg. Thus, a dv/dt breakdown of the IGBT 60 can be prevented.

However, if the resistance of the gate resistor Rg is increased more than needed, i.e., if the value of dv/dt during turn-off is too small, the area of the hatched portion increases accordingly, and therefore turn-off loss increases (FIG. 11). In the case where turn-off loss is too large, the IGBT 60 is broken by the heat caused by the turn-off loss (breakdown due to turn-off loss is hereinafter referred to as thermal breakdown). Thus, there is a trade-off between dv/dt breakdown and thermal breakdown, and the resistance of the gate resistor Rg needs to be adjusted to an optimum value.

FIGS. 12A to 12C are diagrams showing other examples of a circuit including the switching element 60 and gate resistors connected thereto.

FIG. 9 shows a configuration in which one gate resistor Rg is connected to the gate G of the IGBT 60. Both a gate charge current during turn-on and a gate discharge current during turn-off pass through the same gate resistor Rg. Accordingly, a characteristic (e.g., dv/dt) during turn-off and a characteristic (e.g., rise time) during turn-on cannot be controlled separately.

On the other hand, each of the circuits in FIGS. 12A to 12C has a configuration in which a gate resistor Rgon and a rectifier diode 70 connected in series are connected to the gate G of the IGBT 60 and in which the rectifier diode 70 and a gate resistor Rgoff are connected in parallel. In this configuration, a gate charge current flows into the gate G of the IGBT 60 through the resistor Rgon and the rectifier diode 70 during turn-on, and a gate discharge current flows through the resistor Rgoff (and the resistor Rgon) during turn-off. Since the resistors Rgon and Rgoff can be set separately, a characteristic during turn-on and a characteristic during turn-off can be controlled independently.

As described above, in an IGBT, it is desirable that a characteristic during turn-on and a characteristic during turn-off can be controlled independently. A configuration such as shown in FIGS. 12A to 12C is preferable in which the gate resistors Rgon and Rgoff and the rectifier diode 70 are externally connected to the chip of the IGBT 60 to cause a gate charge current during turn-on and a gate discharge current during turn-off to flow through the different gate resistors Rgon and Rgoff, respectively.

In particular, for the purpose of preventing a dv/dt breakdown of an IGBT used as a switching element for current control for a light-emitting device, it is important to appropriately select the gate resistor Rgoff having a resistance in a range which allows the IGBT to operate safely and desired characteristics to be obtained.

Accordingly, when a chip of an IGBT or a package product in which an IGBT chip is sealed with resin or the like is supplied to a user, it is recommended to use the IGBT within its rating in which the operation of the IGBT is guaranteed (e.g., to connect the gate resistor Rgoff having such a resistance that dv/dt is 400 V/μs or less).

However, when the chip of the IGBT 60 is configured to be externally connected to the gate resistor Rgoff as shown in FIGS. 12A to 12C (or the gate resistor Rg in FIG. 9 in the same manner), a user may connect the chip of the IGBT 60 to a gate resistor Rgoff having a resistance out of the dv/dt rating. This may cause a problem of a dv/dt breakdown of the IGBT 60.

SUMMARY OF THE INVENTION

The invention provides an insulated gate semiconductor device that includes a first semiconductor layer of a first general conductivity type, a second semiconductor layer of a second general conductivity type and provided on the first semiconductor layer, and an active area provided in a surface of the second semiconductor layer. The active area is an area where transistor cells of an insulated gate semiconductor element are disposed. The device also includes a diode provided outside the active area on the surface of the second semiconductor layer. The diode has a cathode connected to a gate electrode of the insulated gate semiconductor element and an anode connected to a terminal for connection to a gate drive circuit. The device further includes a resistor provided outside the active area on the surface of the second semiconductor layer. The resistor is connected to both ends of the diode in parallel with the diode.

DESCRIPTION OF THE INVENTIONS

Figure 1A:
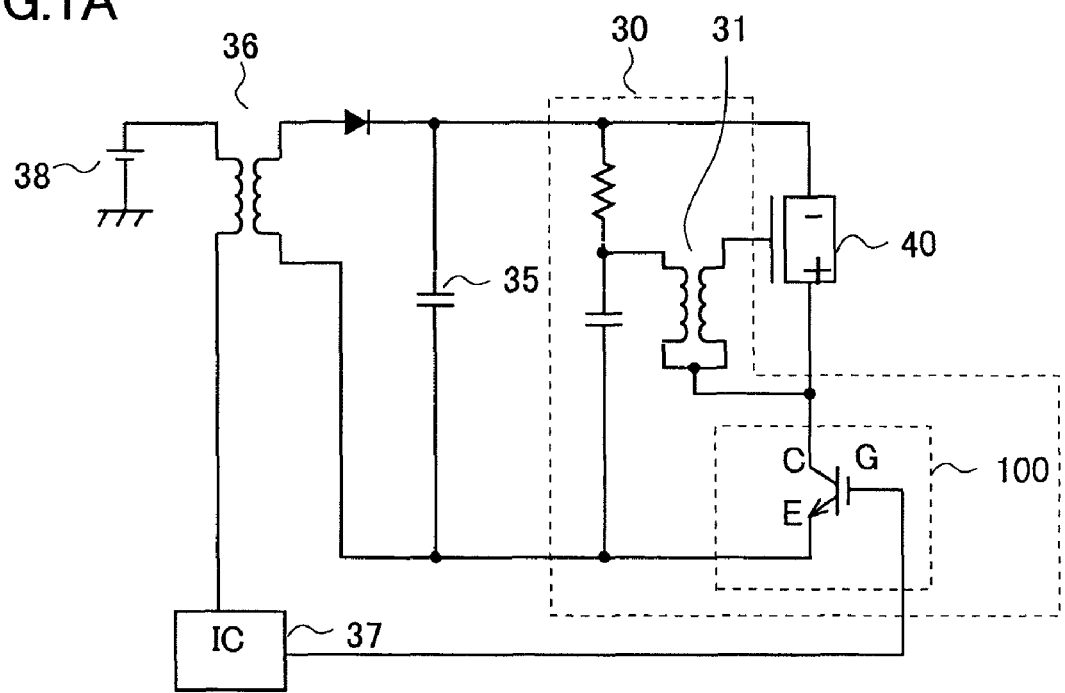
FIG. 1A is a circuit diagram of a light-emitting device for explaining an insulated gate semiconductor device of a first embodiment of the present invention.
Figure 1B:
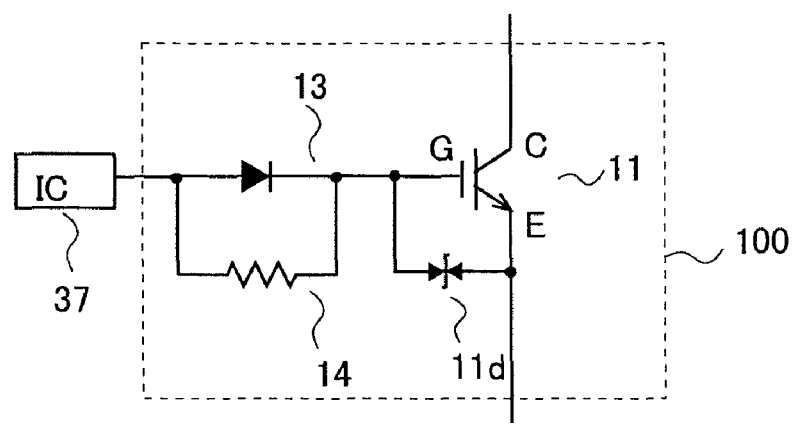
FIG. 1B is a circuit diagram of the insulated gate semiconductor device.

Embodiments of the present invention will be described with reference to FIGS. 1A to 8. First, a first embodiment will be described with reference to FIGS. 1A to 5C. FIGS. 1A and 1B are views showing one example in which an insulated gate semiconductor device of the first embodiment is employed in a switching element module for current control for a luminous tube of a light-emitting device. FIG. 1A is a schematic circuit diagram showing the light-emitting device. FIG. 1B is a circuit diagram showing the insulated gate semiconductor device of the first embodiment.

Figure 9:
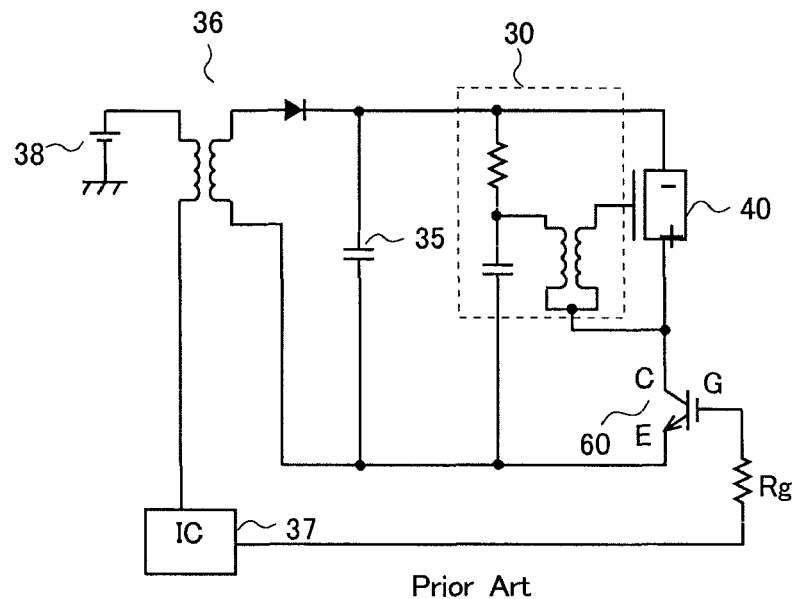
FIG. 9 is a circuit diagram for explaining the related art.

Referring to FIG. 1A, the light-emitting device includes a power-source battery 38, a step-up transformer 36, a main capacitor 35, a trigger circuit 30, a luminous tube 40, a switching element 100, a gate drive circuit 37, and the like. It should be noted that the same components as in the schematic circuit diagram of FIG. 9 are denoted by the same reference numerals.

The principal operation of this circuit is as follows: the step-up transformer 36 raises the voltage of the power-source battery 38 to a high voltage of approximately several hundred volts, and sends this current to the main capacitor 35, where charge is stored.

When the switching element 100 is turned on by the gate drive circuit 37, the voltage between side surfaces of the luminous tube (xenon discharge tube) 40 is raised to approximately several thousand volts by a transformer 31 in the trigger circuit 30, and the luminous tube (xenon discharge tube) 40 is excited. Thus, a discharge path of the main capacitor 35 is formed, and the luminous tube 40 starts discharge light emission. In the case where the amount of light emitted is adjusted, the switching element 100 is turned off with predetermined timing to stop the discharge light emission of the luminous tube 40. In the case where light is not adjusted, the light emission finishes simultaneously with the completion of discharge of the main capacitor 35.

The insulated gate semiconductor device of the first embodiment, which serves as the switching element 100 in FIG. 1A, will be described with reference to FIG. 1B.

The insulated gate semiconductor device 100 includes an IGBT 11, a rectifier diode 13, and a resistor 14. A collector C of the IGBT 11 is connected to one end of the luminous tube 40, and an emitter E thereof is connected to one end of the transformer 31 in the trigger circuit 30. A cathode CA of the rectifier diode 13 is connected in series with a gate G of the IGBT 11, and an anode A of the rectifier diode 13 is connected to a terminal for connection to the gate drive circuit 37. The resistor 14 is connected between the cathode CA and the anode A of the rectifier diode 13 in parallel with the rectifier diode 13. Further, the IGBT 11 has a gate overvoltage protection diode (hereinafter referred to as the protection diode) 11d, which is a bidirectional Zener diode, connected between the gate G and the emitter E thereof.

Figure 2:
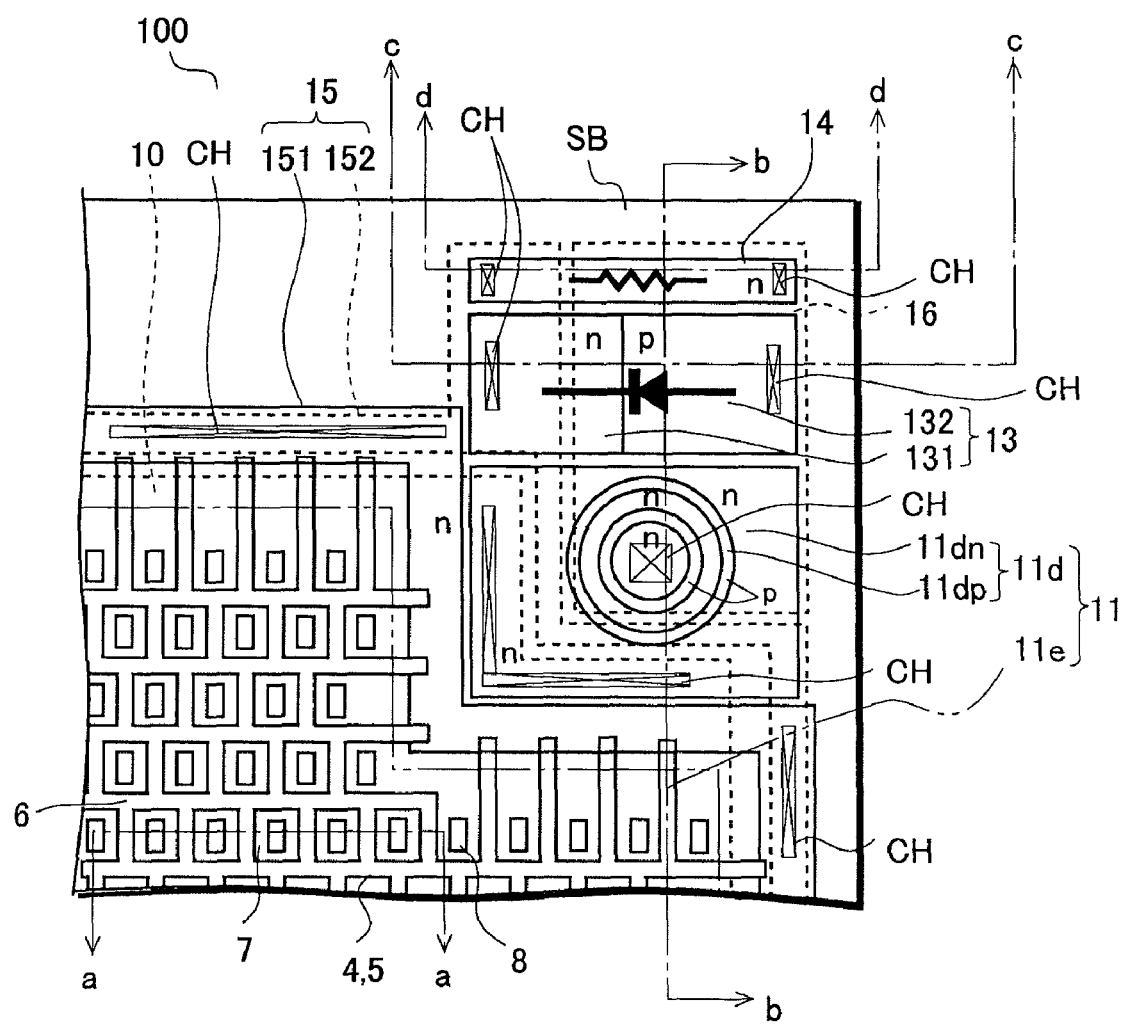
FIG. 2 is a plan view for explaining the insulated gate semiconductor device of the first embodiment of the present invention.
Figure 3:
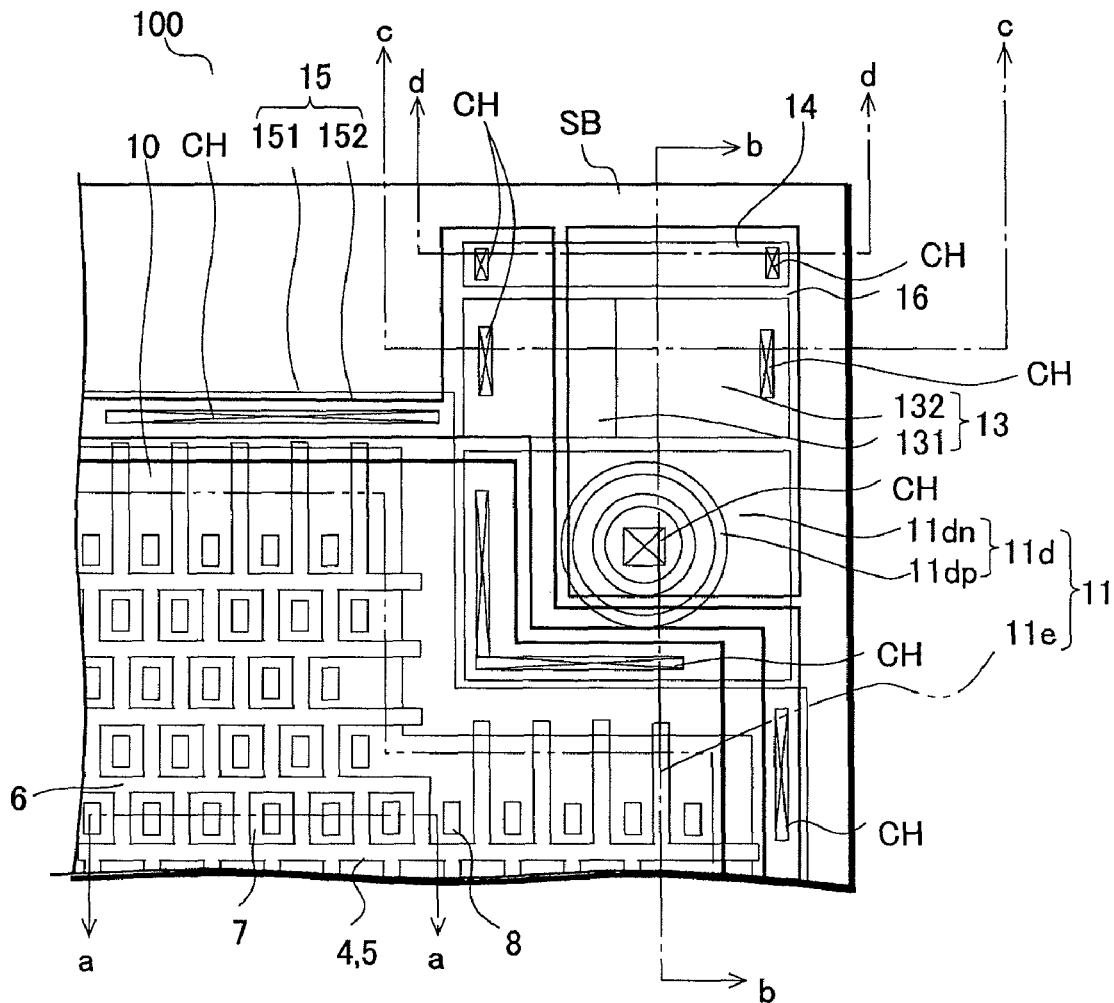
FIG. 3 is a plan view for explaining the insulated gate semiconductor device of the first embodiment of the present invention.
Figure 4:
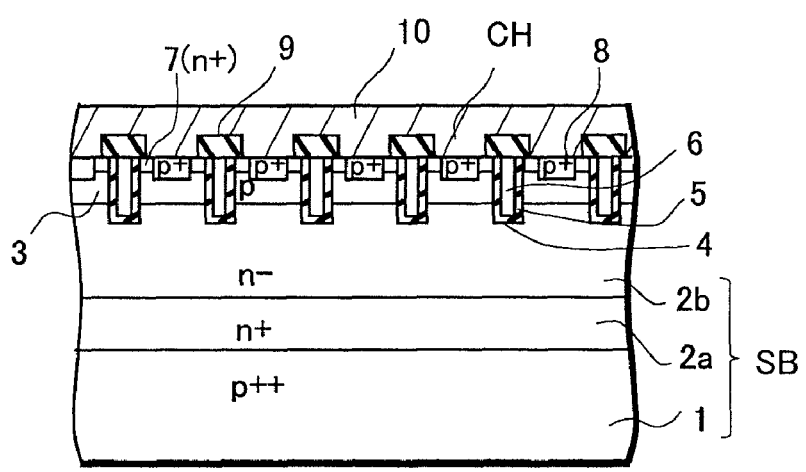
FIG. 4 is a cross-sectional view for explaining the insulated gate semiconductor device of the first embodiment of the present invention.
Figure 5A:
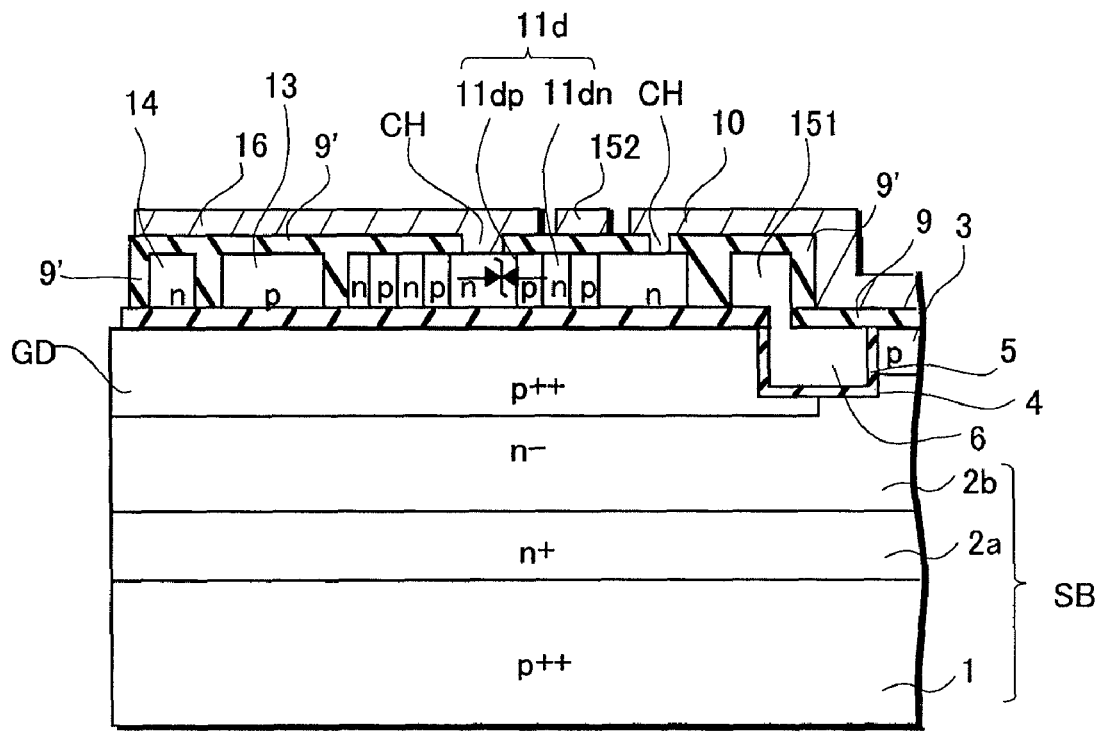
FIG. 5 is a cross-sectional view for explaining the insulated gate semiconductor device of the first embodiment of the present invention.
Figure 5B:
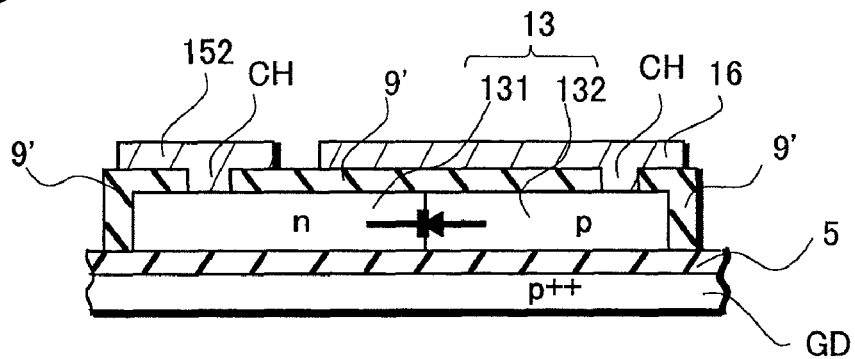
Figure 5C:
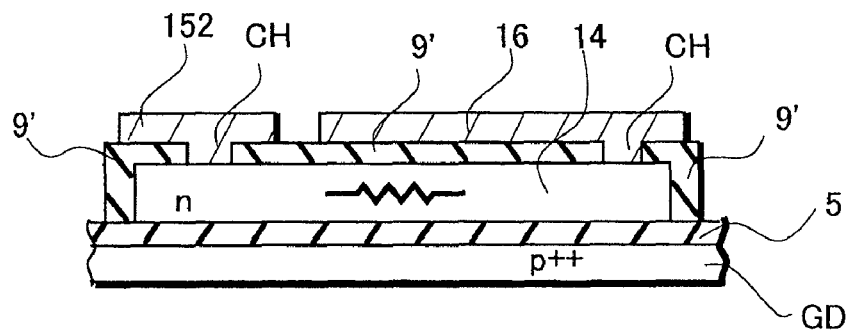

The structure of the insulated gate semiconductor device 100 will be described with reference to FIGS. 2 to 5C. FIGS. 2 and 3 are plan views showing part of a chip of the insulated gate semiconductor device 100. In FIG. 2, the structure on the surface of a substrate SB is shown, and an electrode layer is indicated by broken lines. In FIG. 3, the pattern of the electrode layer on the surface is shown. FIG. 4 is a cross-sectional view taken along line a-a in FIGS. 2 and 3. FIGS. 5A to 5C are a cross-sectional view (FIG. 5A) taken along line b-b in FIGS. 2 and 3, a cross-sectional view (FIG. 5B) taken along line c-c therein, and a cross-sectional view (FIG. 5C) taken along line d-d therein. It should be noted that in FIGS. 5B and 5C, the structure of the substrate SB is the same as in FIG. 5A and therefore not shown.

Referring to FIG. 2, the insulated gate semiconductor device 100 is formed by integrating the IGBT 11, the rectifier diode 13, and the resistor 14 into one chip (same substrate).

The IGBT 11 includes an active area 11e (two-dot chain lines) and the protection diode 11d in a surface of the substrate SB. In the active area 11e, multiple IGBT cells are disposed. Here, the case of an n-channel IGBT is taken as one example.

Outside the active area 11e, a gate interconnection portion 15 is provided to connect a gate electrode 6 with a gate pad portion 16. The gate interconnection portion 15 includes a first gate interconnection 151 and a second gate interconnection 152. The first gate interconnection 151 is provided in the substrate surface and made of a polysilicon layer. The second gate interconnection 152 extends to partially overlap the first gate interconnection 151. The second gate interconnection 152 is in the same metal layer as an emitter electrode 10 in the active area 11e and the gate pad portion 16 (FIG. 3).

The structure of the active area 11e of the IGBT 11 will be described with reference to FIG. 4.

For example, a channel layer 3 as a p type impurity region is provided on the surface of the substrate SB in which an n+ type semiconductor layer 2a and an n− type semiconductor layer 2b are stacked on a p++ type silicon semiconductor substrate 1. A trench 4 penetrating the channel layer 3 is provided, and inner walls of the trench 4 are covered with a gate insulating film 5. In the trench 4, a conductive layer such as a polysilicon layer doped with impurities is buried to provide a gate electrode 6. Emitter regions 7 which are n type impurity regions are provided adjacent to the gate electrode 6 on the surface of the channel layer 3. Body regions 8 are provided between the emitter regions 7 on the surface of the channel layer 3. The top of the gate electrode 6 is covered with an interlayer insulating film 9, and the emitter electrode 10 is provided on the surface of the substrate SB. The emitter electrode 10 are in the same metal layer made of aluminum (Al) or the like as the gate pad portion 16 and the second gate interconnection 152, and are in contact with the emitter regions 7 through contact holes CH surrounded by the interlayer insulating film 9. Thus, the regions surrounded by the trench 4 serve as transistor cells, and the multiple transistor cells are arranged to constitute the active area 11e. It should be noted that in this embodiment, the region where the channel layer 3 is formed is referred to as the active area 11e for convenience of explanation.

It is noted that conductivity types such as n+, n and n− belong in a general conductivity type, and conductivity types such as p+, p and p− belong in the other general conductivity type.

The emitter electrode 10 extends to a region over the protection diode 11d outside the active area 11e to be in contact with one end of the protection diode 11d (see FIGS. 2 and 3).

A gate voltage is applied to the gate electrode 6 of the IGBT 11 from the gate pad portion 16 through the resistor 14, the rectifier diode 13, and the gate interconnection portion 15.

Referring to FIGS. 2 and 5A, a guard ring GD which is a p type impurity region is provided outside the active area 11e, e.g., in a chip corner portion, on the surface of the n− type semiconductor layer 2b. The resistor 14, the rectifier diode 13, and the protection diode 11d are provided on the surface of the substrate SB with the insulating film 5 covering the surface of the guard ring GD interposed therebetween.

The resistor 14, the rectifier diode 13, and the protection diode 11d are made of the same polysilicon layer as the first gate interconnection 151 and the gate electrode 6. On the resistor 14, the rectifier diode 13, and the protection diode 11d, an insulating film 9' is provided. On the insulating film 9', the gate pad portion 16 is provided which continuously covers part of each of the resistor 14, the rectifier diode 13, and the protection diode 11d.

On other part of each of the resistor 14, the rectifier diode 13, and the protection diode 11d, the second gate interconnection 152 extends with the insulating film 9' interposed therebetween.

The protection diode 11d is a bidirectional Zener diode in which several pn junctions are formed by disposing n type impurity regions 11dn formed by introducing n type impurities into a polysilicon layer and p type impurity regions 11dp formed by introducing p type impurities into the polysilicon layer, for example, concentrically. For example, the central n type semiconductor region 11dn is in contact with the gate pad portion 16 through a contact hole CH provided in the insulating film 9', and the outermost n type semiconductor region 11dn is in contact with the emitter electrode 10 through a contact hole CH. This prevents the gate insulating film 5 from being broken by a voltage applied between the gate and the emitter of the IGBT 11 from outside. It should be noted that the number of pn junctions in series in the protection diode 11d is one example, and is appropriately selected in accordance with a breakdown voltage.

Referring to FIGS. 2 and 5B, the rectifier diode 13 includes an n type semiconductor region 131 and a p type semiconductor region 132 which are respectively formed by introducing n type impurities and p type impurities into a polysilicon layer. The p type semiconductor region 132 serving as the anode A is in contact with the gate pad portion 16 through a contact hole CH provided in the insulating film 9', and the n type semiconductor region 131 serving as the cathode CA is in contact with the second gate interconnection 152 through a contact hole CH. Referring to FIGS. 2 and 5C, the resistor 14 is formed by introducing, for example, n type impurities into a polysilicon layer, and has a sheet resistance of 6 ohms/square to several tens of ohms/square. One end of the resistor 14 is in contact with the gate pad portion 16 through a contact hole CH provided in the insulating film 9', and the other end of the resistor 14 is in contact with the second gate interconnection 152 through a contact hole CH.

Thus, the rectifier diode 13 and the resistor 14 are connected in parallel, and the cathode CA of the rectifier diode 13 and one end of the resistor 14 are connected to the gate (gate electrode 6) of the IGBT 11 through the gate interconnection portion 15. The anode A of the rectifier diode 13 and the other end of the resistor 14 are connected to the terminal for connection to the gate drive circuit 37 (see FIGS. 1A and 1B) outside the insulated gate semiconductor device (IGBT chip) 100 through the gate pad portion 16 and unillustrated external connection means (e.g., bonding wires, metal plates, or the like) connected to the gate pad portion 16.

This configuration causes a gate charge current to flow into the gate G of the IGBT 11 through the rectifier diode 13 in the chip 100 during the turn-on of the IGBT 11. On the other hand, during the turn-off of the IGBT 11, a gate discharge current flows into the terminal for connection to the gate drive circuit 37 through the resistor 14 in the chip 100 (see FIG. 1B).

Accordingly, the value of dv/dt during the turn-off of the IGBT 11 can be set independently (with no consideration given to effect on turn-on rise time tr). Further, the value of the resistor 14 can be selected in accordance with the purpose (in this embodiment, a switching element module for a light-emitting device) of the IGBT 11, which is integrated into the same chip, to limit the value of dv/dt during the turn-off of the IGBT 11 to a desired value or less.

In other words, it is possible to provide the IGBT chip 100 having the function of limiting dv/dt during turn-off. Accordingly, for example, even if a gate resistor is not externally connected to the IGBT chip 100 at a site (user site) to which the chip or a package product formed by sealing the chip with resin or the like is supplied, the IGBT 11 can be prevented from being broken by excessive dv/dt.

Specifically, a guaranteed value of dv/dt during turn-off for application to a light-emitting device is generally 300 V/μs to 400 V/μs. In this embodiment, as one example, the IGBT chip 100 in which the value of dv/dt is limited to 400 V/μs or less can be provided by setting the resistance of the resistor 14 to 50Ω to 100 Ω.

Figure 12A:
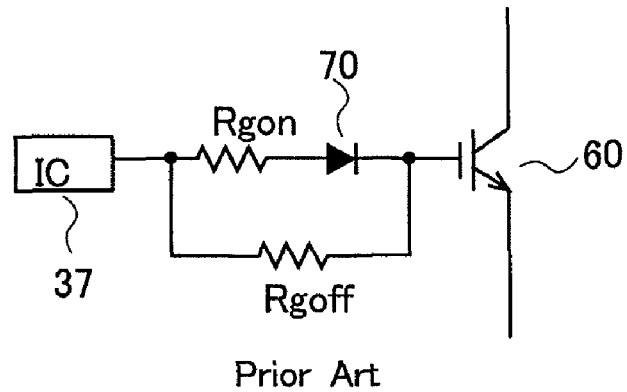
FIGS. 12A to 12C are circuit diagrams for explaining the related art.
Figure 12B:
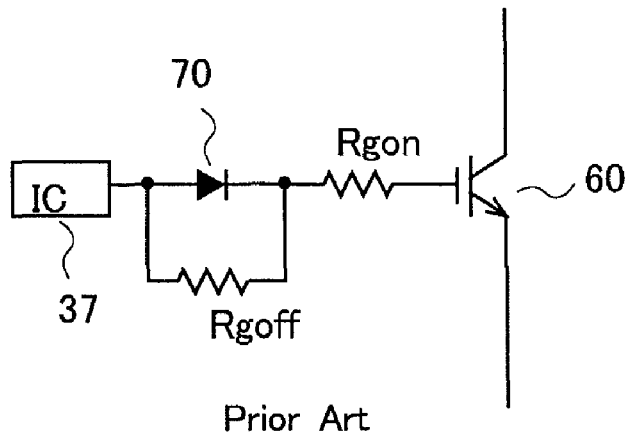
Figure 12C:
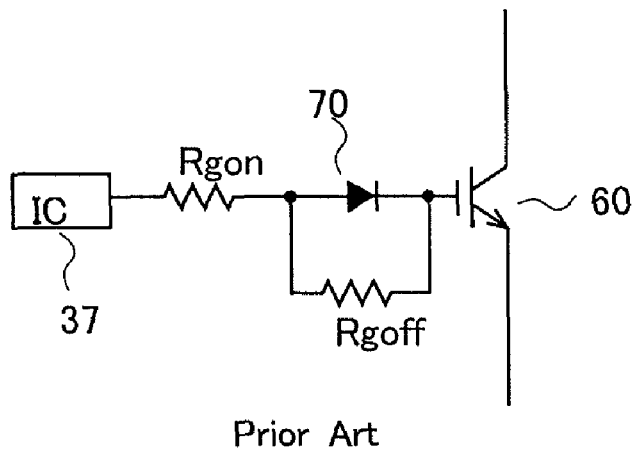

In the first embodiment, the diode 13 and the resistor 14 for preventing excessive dv/dt during the turn-off of the IGBT 11 are provided under the gate pad portion 16. Accordingly, the chip 100 of the IGBT 11 has a built-in function for protecting the IGBT 11 from being broken by excessive dv/dt. Also, the first embodiment can contribute to the miniaturization of devices in comparison to the conventional structures (FIGS. 12A to 12C) used as switching elements by employing external gate resistors.

Figure 6:
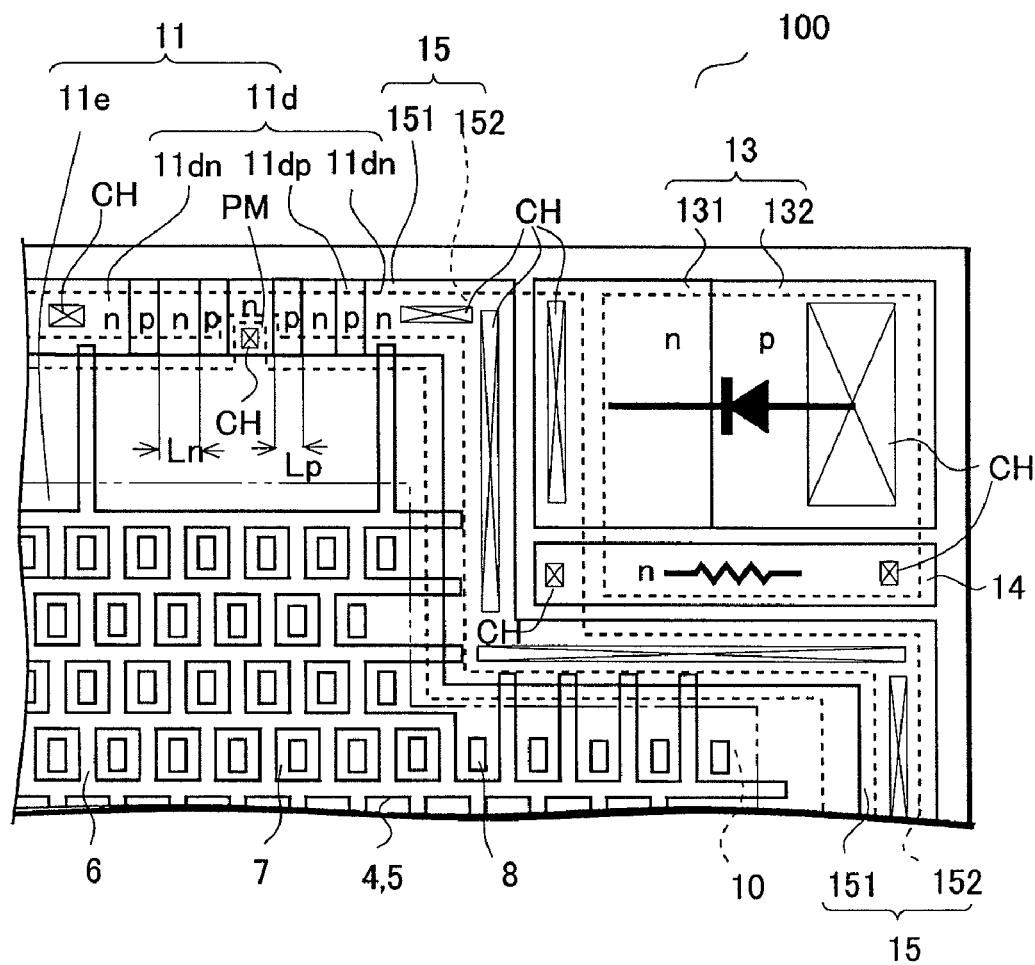
FIG. 6 is a plan view for explaining an insulated gate semiconductor device of a second embodiment of the present invention.
Figure 7:
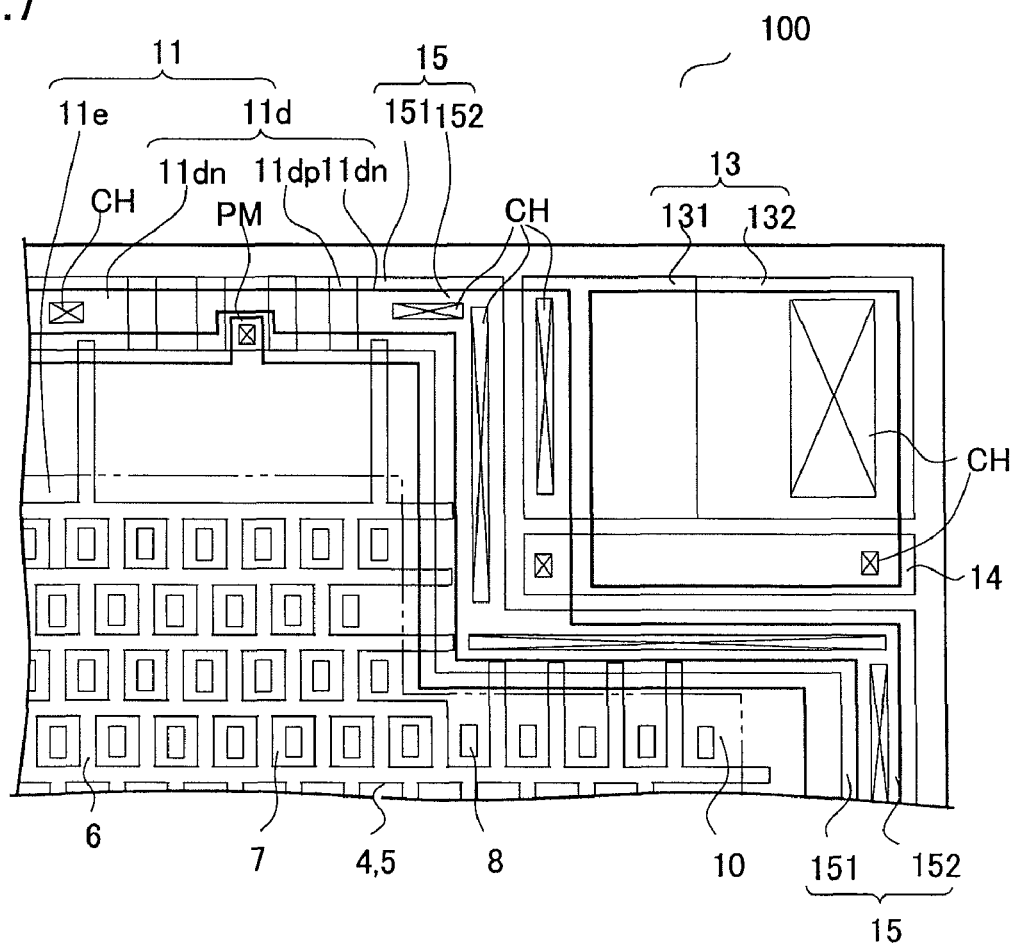
FIG. 7 is a plan view for explaining the insulated gate semiconductor device of the second embodiment of the present invention.
Figure 8:
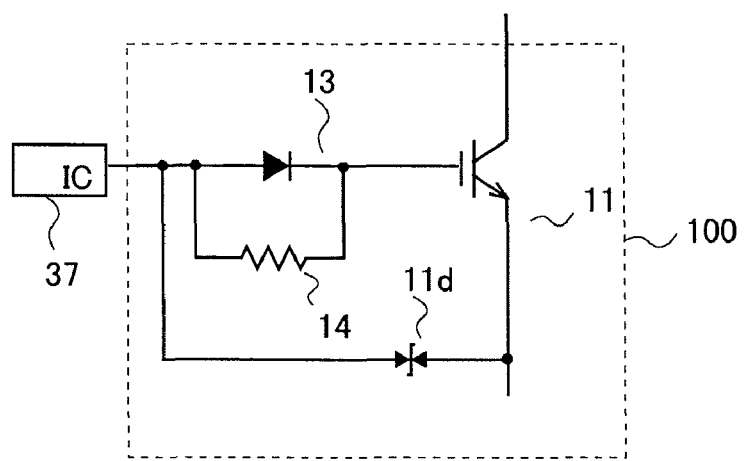
FIG. 8 is a circuit diagram for explaining the insulated gate semiconductor device of the second embodiment of the present invention.

A second embodiment will be described with reference to FIGS. 6 to 8. In the second embodiment, a protection diode 11*d* is provided for a gate interconnection portion 15 of an IGBT 11. FIGS. 6 and 7 are plan views showing the second embodiment. In FIG. 6, the structure on the surface of a substrate SB is shown, and an electrode layer is indicated by broken lines. In FIG. 7, the pattern of the electrode layer on the surface is shown. FIG. 8 is a circuit diagram showing an insulated gate semiconductor device 100 of the second embodiment. It should be noted that the same components as in the first embodiment are denoted by the same reference numerals.

A first gate interconnection 151 of the gate interconnection portion 15 is a polysilicon layer which is doped with, for example, n type impurities to be a conductor. In the second embodiment, n type semiconductor regions 11*do* and p type semiconductor regions 11*dp* are alternately disposed in part of the first gate interconnection 151 to form a bidirectional Zener diode which is used as the protection diode 11*d*.

On the protection diode 11*d*, a second gate interconnection 152 extend with an insulating film (not shown) interposed therebetween. Further, for example, the n type semiconductor regions 11*dn* at both ends of the protection diode 11*d* are in contact with the second gate interconnection 152 through contact holes CH provided in the insulating film. The n type semiconductor region 11*dn* in a central portion of the protection diode 11*d* is connected to an emitter electrode 10 of the IGBT 11 through a contact hole CH provided in the insulating film. The emitter electrode 10 has a protruding portion PM. The protruding portion PM extends to a region over the protection diode 11*d* to be in contact with the protection diode 11*d*.

Except for the above, the structure is similar to that of the first embodiment and will not be further described.

Thus, the protection diode 11*d* can be connected between the gate and the emitter of the IGBT 11 (FIG. 8). It should be noted that the number of pn junctions in series in the protection diode 11*d* and the positions of contact of the protection diode 11*d* with the second gate interconnection 152 and the emitter electrode 10 are one examples, and are appropriately selected in accordance with a breakdown voltage.

Figure 10:
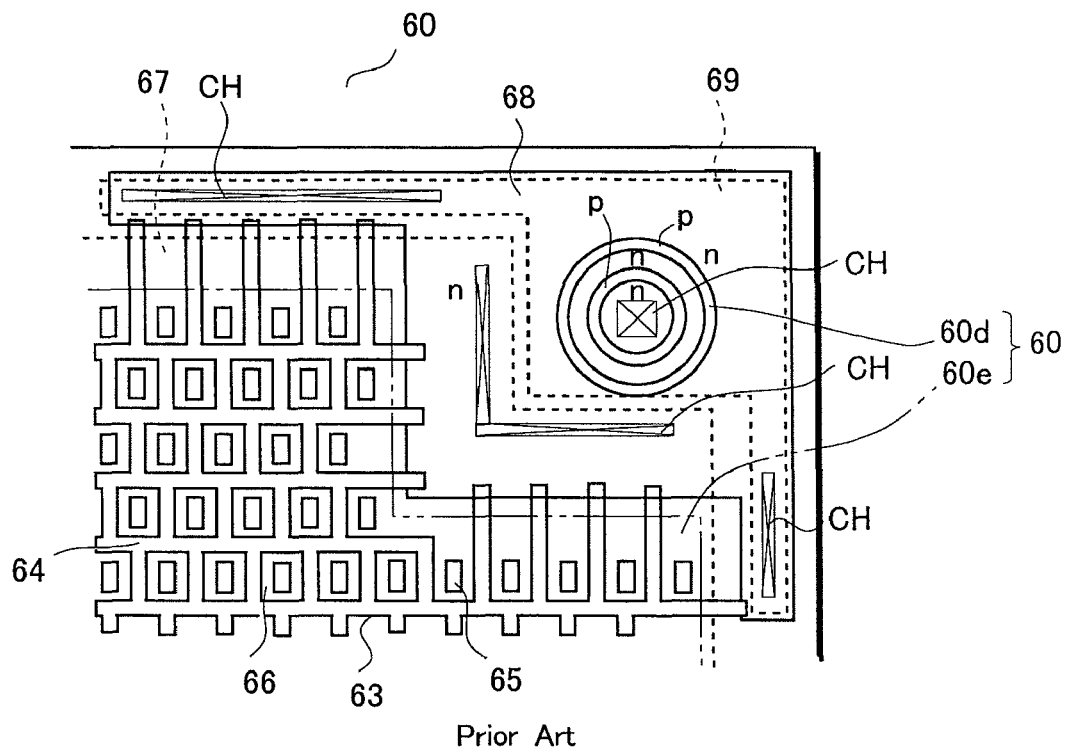
FIG. 10 is a plan view for explaining the related art.
Figure 11:
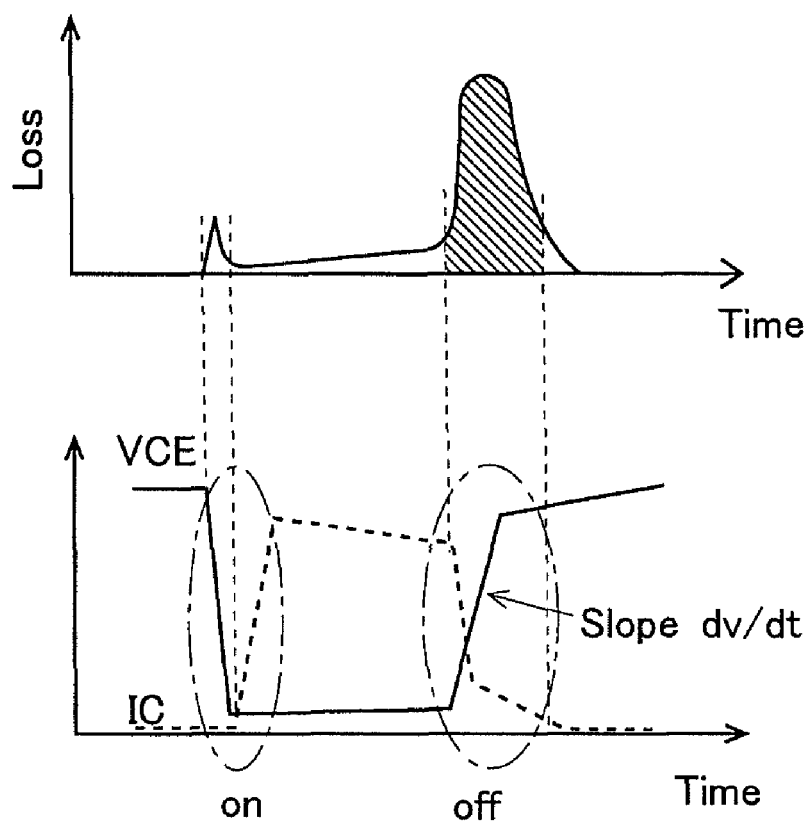
FIG. 11 is a characteristic diagram for explaining the related art.

Providing the protection diode 11*d* in part of the first gate interconnection 151 makes it possible to dispose only the rectifier diode 13 and the resistor 14 under the gate pad portion 16. Thus, the insulated gate semiconductor device 100 having the function of preventing the IGBT 11 from being broken by excessive dv/dt can be provided without an increase in the size of a chip and an increase in the area of an active area in comparison to the size of the chip (see FIG. 10) and the area of the active area 60*e* of the conventional IGBT 60.

It should be noted that the shape of the resistor 14 is not limited to a strip shape such as shown in FIGS. 2 and 6 and may have a bent pattern. Bending the resistor 14 into, for example, an L shape or a winding shape makes it possible to utilize a vacant space on the chip to dispose the resistor 14.

While embodiments of the present invention have been described by taking an n-channel IGBT as an example, the present invention can also be similarly carried out on a p-channel IGBT of the second general conductivity-type.

According to the present invention, firstly, by integrating a rectifier diode and a resistor connected in parallel into the same chip as an IGBT and connecting a cathode of the rectifier diode to a gate of the IGBT, the value of dv/dt during turn-off can be limited within the chip of the IGBT. In other words, since the chip includes a resistor (gate resistor Rgoff) having such a resistance that the IGBT can be prevented from being broken, the IGBT can be prevented from being broken by an increase in dv/dt at a site (user site) to which the chip or a package product formed by sealing the chip with resin or the like is supplied.

Even if an externally-connected gate resistor is not connected at a user site, a breakdown of the IGBT can be prevented by determining a gate resistor Rgoff having dv/dt which does not reach a value resulting in a dv/dt breakdown.

Secondly, monolithically forming the rectifier diode and the resistor in a device contributes to the miniaturization of the device as a switching element in comparison to the case where a gate resistor having the same resistance and a rectifier diode are externally connected.

Thirdly, since the rectifier diode and the resistor are disposed under a gate pad portion of the IGBT, an IGBT in which a breakdown due to an increase in dv/dt during turn-off is avoided can be provided without a significant increase in chip size.

Fourthly, since a gate-to-emitter protection diode is provided in a gate interconnection portion outside an active area, and the diode and the resistor are disposed under the gate pad portion, an IGBT in which a breakdown due to an increase in dv/dt is avoided can be provided without an increase in chip size in comparison to conventional chip sizes.

What is claimed is:
1. An insulated gate semiconductor device comprising:
   a first semiconductor layer of a first general conductivity type;

a second semiconductor layer of a second general conductivity type and provided on the first semiconductor layer;

an active area provided in a surface of the second semiconductor layer, the active area being an area where transistor cells of an insulated gate semiconductor element are disposed;

a diode provided outside the active area on the surface of the second semiconductor layer, the diode having a cathode connected to a gate electrode of the insulated gate semiconductor element and an anode connected to a terminal for connection to a gate drive circuit, the diode being connected to the gate electrode so that a current from the gate drive circuit flows from the anode to cathode of the diode so as to be supplied to the gate electrode; and a resistor provided outside the active area on the surface of the second semiconductor layer, the resistor being connected to both ends of the diode in parallel with the diode.

2. The insulated gate semiconductor device according to claim 1, wherein a rate of voltage change during turn-off of the insulated gate semiconductor element is limited to a desired value or less.

3. The insulated gate semiconductor device according to claim 2, further comprising a gate pad portion connected to the gate electrode, wherein the diode and the resistor are disposed under the gate pad portion.

4. The insulated gate semiconductor device according to claim 3, further comprising a gate interconnection portion provided outside the active area on the surface of the second semiconductor layer, the gate interconnection portion connecting the gate electrode with the gate pad portion, and another diode provided under the gate interconnection portion.

5. The insulated gate semiconductor device according to any one of claims 1 to 4, wherein the insulated gate semiconductor element is an IGBT for performing current control for a luminous tube.

* * * * *